(12) United States Patent
Uedaira et al.

(10) Patent No.: US 9,159,757 B2
(45) Date of Patent: Oct. 13, 2015

(54) PHOTODETECTION DEVICE AND SENSOR PACKAGE

(71) Applicant: Rohm Co., Ltd., Kyoto (JP)

(72) Inventors: Yoshitsugu Uedaira, Kyoto (JP); Takahiro Kitahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/464,020

(22) Filed: Aug. 20, 2014

(65) Prior Publication Data

US 2015/0076642 A1    Mar. 19, 2015

(30) Foreign Application Priority Data

Sep. 18, 2013 (JP) ................................. 2013-193272

(51) Int. Cl.
*H01L 27/146* (2006.01)
(52) U.S. Cl.
CPC ...... *H01L 27/14621* (2013.01); *H01L 27/1463* (2013.01); *H01L 27/14607* (2013.01)
(58) Field of Classification Search
CPC .................................................. H01L 27/146
See application file for complete search history.

(56) References Cited

U.S. PATENT DOCUMENTS

| 2006/0054782 A1* | 3/2006 | Olsen et al. ............... 250/208.1 |
| 2013/0087682 A1* | 4/2013 | Nomura ....................... 250/206 |
| 2014/0063501 A1* | 3/2014 | Hirokubo ..................... 356/416 |

FOREIGN PATENT DOCUMENTS

| JP | 2009-004680 | 1/2009 |
| JP | 2012-084745 | 4/2012 |
| JP | 2013105963 | 5/2013 |

* cited by examiner

*Primary Examiner* — Thanh V Pham
(74) *Attorney, Agent, or Firm* — Fish & Richardson P.C.

(57) ABSTRACT

A photodetection device of the present invention includes a semiconductor substrate which is defined such that a first light-receiving portion and a second light-receiving portion are spaced from one another, and an optical filter which is formed on the semiconductor substrate, and includes a first filter which is disposed so as to cover the first light-receiving portion, to selectively allow an optic element in a first wavelength band to transmit through, and a second filter which is disposed so as to cover the second light-receiving portion, to selectively allow an optic element in a second wavelength band different from the first wavelength band, to transmit through, and the optical filter has a filter laminated structure which is defined such that edge portions of the first filter and the second filter overlap one another on a boundary region between the first light-receiving portion and the second light-receiving portion.

14 Claims, 6 Drawing Sheets

PHOTODETECTION DEVICE AND SENSOR PACKAGE

CROSS-REFERENCE TO RELATED APPLICATIONS

The present application corresponds to Japanese Patent Application No. 2013-193272, which is filed in the Japan Patent Office on Sep. 18, 2013, and the entire disclosure of which is incorporated herein by reference.

FIELD OF THE INVENTION

The present invention relates to a photodetection device and a sensor package having the same.

BACKGROUND ART

For example, Patent Document 1 (Japanese Patent Application Publication No. 2009-4680) has disclosed a solid-state imaging apparatus which includes an n-type semiconductor substrate, a p-type semiconductor layer which is laminated on the n-type semiconductor substrate, an interlayer insulating film which is laminated on the p-type semiconductor layer, multilayer interference filters which are laminated in sequence on the interlayer insulating film, and a flattened film, and a plurality of photodiodes which are defined in a state of being spaced from one another downward in a thickness direction of the p-type semiconductor layer from the boundary between the p-type semiconductor layer and the interlayer insulating film. The multilayer interference filters differ in thickness so as to correspond to the respective photodiodes, and are specified in transmissive band at each region so as to correspond to the photodiodes.

BRIEF SUMMARY OF THE INVENTION

In an apparatus having an arrangement in which a plurality of photodiodes are adjacent to one another as in Patent Document 1, in some cases, an optic element obliquely transmitting through a filter corresponding to one of the photodiodes is incident into the other photodiode across the boundary region with another photodiode.

Although it may not be problematic that the incident optic element is within a wavelength band which may be detected by the other photodiode, in the case where the optic element is an element in a different wavelength band, this is a noise component for the other photodiode.

Then, conventionally, in order to prevent a noise component from being incident into the other photodiode, one of the photodiodes is arranged far away from the other photodiode. However, due to this countermeasure, the interval between the adjacent photodiodes is restricted, which has made it difficult to downsize the entire layout region for the photodiodes.

An object of the present invention is to provide a photodetection device in which it is possible to increase the degree of freedom of an interval between adjacent light-receiving portions, which makes it possible to lessen the entire light-receiving region, and a sensor package having the photodetection device.

DETAILED DESCRIPTION OF THE INVENTION

Figure 1:
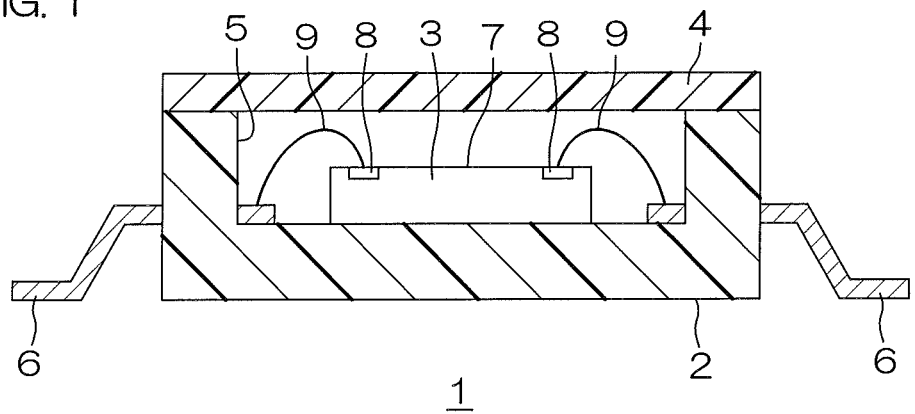
FIG. 1 is a cross-sectional view of a sensor package according to a preferred embodiment of the present invention.

A photodetection device of the present invention includes a semiconductor substrate having a first light-receiving portion and a second light-receiving portion, and an optical filter formed on the semiconductor substrate, the optical filter including a first filter covering the first light-receiving portion and a second filter covering the second light-receiving portion, the first filter is permeable allowing an optic element within a first wavelength band to pass through the same, the second filter is permeable allowing an optic element within a second wavelength band different from the first wavelength band, to pass through the same, and the optical filter has a filter laminated structure which is defined such that edge portions of the first filter and the second filter overlap one another on a boundary region between the first light-receiving portion and the second light-receiving portion.

In accordance with this arrangement, it is possible to extend the edge portions of the first filter and the second filter respectively up to the vicinities of the first light-receiving portion and the second light-receiving portion by defining the filter laminated structure. Thereby, it is possible to secure a distance from the first light-receiving portion to the peripheral edge of a region through which the optic element in the second wavelength band is not allowed to transmit (the region covered by the first filter), broader than the arrangement in which the first filter and the second filter are adjacent to one another in a cross direction (a direction along the top surface of the semiconductor substrate) on the boundary region. In the same way reversely, it is possible to secure a distance from the second light-receiving portion to the peripheral edge of a region through which the optic element in the first wavelength band is not allowed to transmit (the region covered by the second filter), broad. Therefore, even when the interval between the first light-receiving portion and the second light-receiving portion which are adjacent to one another is relatively narrowed, it is possible to cut a noise component by any one of the first filter and the second filter which is a part of the filter laminated structure. Therefore, it is possible to downsize the entire light-receiving region by shortening a pitch between the first light-receiving portion and the second light-receiving portion while preventing a false detection of a noise component. Thereby, it is possible to provide a compact photodetection device.

The edge portions of the first filter and the second filter may be respectively extended up to a side closer to the second light-receiving portion and the first light-receiving portion than a center of the boundary region.

In accordance with this arrangement, it is possible to obtain a distance from the first light-receiving portion to the peripheral edge of a region through which the optic element in the second wavelength band is not allowed to transmit as an amount across the center of the boundary region. In the same way reversely, it is possible to obtain a distance from the second light-receiving portion to the peripheral edge of a region through which the optic element in the first wavelength band is not allowed to transmit as an amount across the center of the boundary region. Thereby, it is possible to satisfactorily cut a noise component whose incident angle is relatively small with respect to each of the first light-receiving portion and the second light-receiving portion.

The photodetection device may further include a metal layer formed along a top surface of the semiconductor substrate between the filter laminated structure and the boundary region.

In accordance with this arrangement, even when a noise component transmits laterally through the filter laminated structure, to head toward the first light-receiving portion and the second light-receiving portion, it is possible to repeatedly reflect the noise component between the metal layer and the filter laminated structure, to be attenuated. Therefore, even when the noise component is detected by the first light-receiving portion and the second light-receiving portion, an effect on the detection accuracy may be sufficiently small.

The metal layer may overlap edge portions of the first light-receiving portion and/or the second light-receiving portion.

In accordance with this arrangement, it is possible to reliably prevent a noise component from being directly incident into the first light-receiving portion and the second light-receiving portion. That is, it is possible to reliably reflect the noise component between the metal layer and the filter laminated structure.

The photodetection device may further include a plurality of interlayer insulating films and a passivation film which are laminated in sequence from the semiconductor substrate between the semiconductor substrate and the optical filter, and the metal layer is disposed on an interlayer insulating film lower than an uppermost insulating film among the plurality of interlayer insulating films.

In accordance with this arrangement, because it is possible to flatten the top surface of the passivation film at least in a region covered by the optical filter, it is possible to reduce harmful effects on the characteristics of the optical filter on the passivation film.

The photodetection device may further include an uppermost wiring which is formed on the uppermost insulating film outside of a region covered by the optical filter, and is covered with the passivation film.

In accordance with this arrangement, because the passivation film is not necessarily flat in the region outside of the region covered by the optical filter, it is possible to effectively utilize this region as a space for defining the wiring.

The metal layer may be made of aluminum.

In accordance with this arrangement, in the case where an aluminum wiring is formed on the interlayer insulating film, it is possible to form the metal layer in the same process as the aluminum wiring.

The photodetection device may further include a p-n junction portion formed on a top surface portion of the semiconductor substrate under the metal layer.

In accordance with this arrangement, even when it is impossible to reflect a noise component transmitting laterally through the filter laminated structure by the metal layer, it is possible to absorb the noise component with the p-n junction portion.

The photodetection device may further include a p-n junction portion formed on the top surface portion of the semiconductor substrate between the filter laminated structure and the boundary region.

In accordance with this arrangement, even when a noise component transmits laterally through the filter laminated structure, to head toward the first light-receiving portion and the second light-receiving portion, it is possible to absorb the noise component with the p-n junction portion.

The filter laminated structure may be defined such that the first filter and the second filter overlap one another several times.

In accordance with this arrangement, it is possible to more effectively cut a noise component in the filter laminated structure.

The optical filter may include a color filter.

In accordance with this arrangement, it is possible to suppress color mixture caused by a noise component.

A width of the boundary region may be 5 μm to 25 μm.

In accordance with this arrangement, it is possible to provide a compact photodetection device with a width of the boundary region of 5 μm to 25 μm.

A sensor package of the present invention includes the photodetection device.

In accordance with this arrangement, because the photodetection device of the present invention which can be downsized is included, it is possible to provide a compact sensor package.

Hereinafter, a preferred embodiment of the present invention will be described in detail with reference to the accompanying drawings.

FIG. 1 is a cross-sectional view of a sensor package 1 according to a preferred embodiment of the present invention.

The sensor package 1 includes a package main body 2, a color sensor chip 3, and an infrared filter 4.

The package main body 2 is made of, for example, a cubic box-shaped light blocking resin having an upper open portion in its top surface. The color sensor chip 3 is provided in a space 5 of the package main body 2. A plurality of leads 6 are provided so as to stride across the interior and exterior of the space 5, to penetrate through the side walls of the package main body 2.

The color sensor chip 3 is installed in a posture of setting its light-receiving surface 7 upward in the space 5 of the package main body 2. For example, the color sensor chip 3 is die-bonded on a die-pad (not shown) integrally formed with some of the plurality of leads 6. A plurality of electrode pads 8 are formed on the light-receiving surface (top surface) 7 of the color sensor chip 3. The electrode pads 8 and the leads 6 are connected in one-on-one with bonding wires 9.

The infrared filter 4 is disposed so as to close the upper open portion of the package main body 2, and selectively cuts (absorbs) an element in a wavelength band (for example, 700 nm to 1300 nm) of an infrared ray of light toward the space 5 in the package main body 2. With the infrared filter 4, it is possible to supply the light from which the optic element in the infrared wavelength band is cut to the color sensor chip 3.

Next, a detailed arrangement of the color sensor chip 3 will be described with reference to FIGS. 2 and 3.

Figure 2:
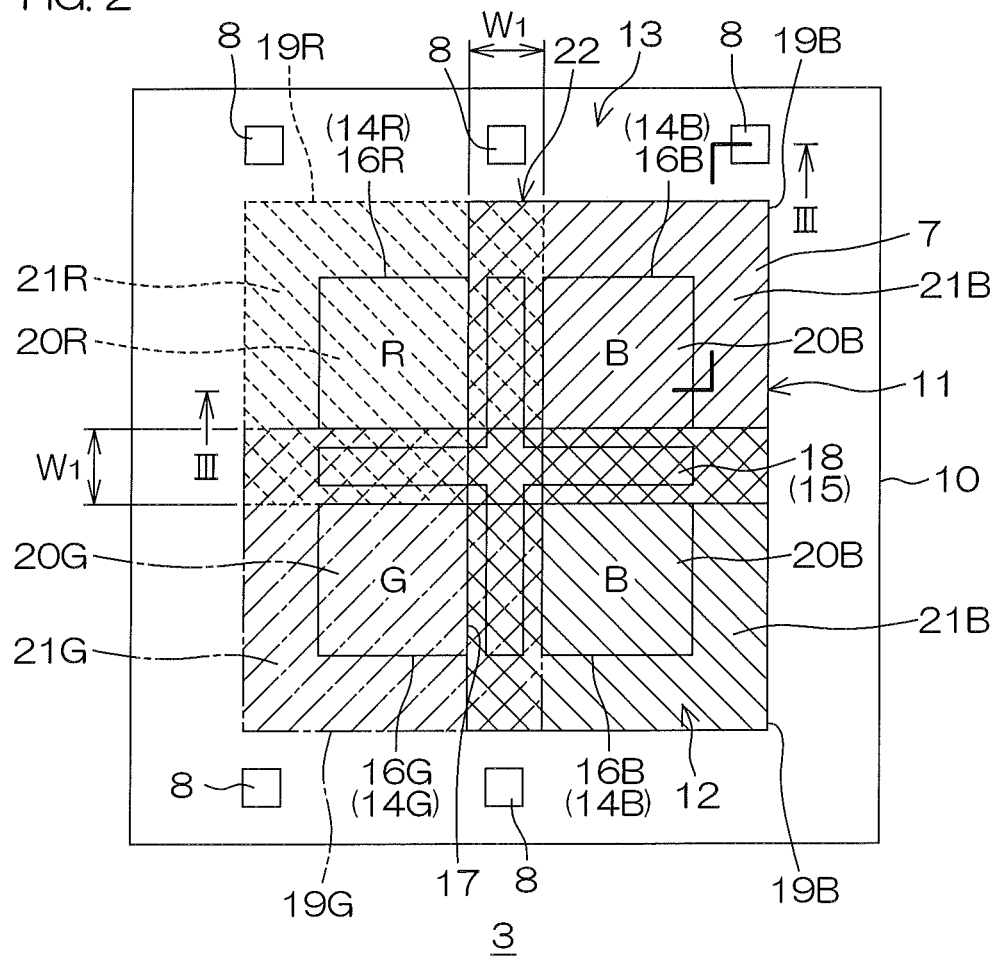
FIG. 2 is a plan view of a color sensor chip of FIG. 1.

FIG. 2 is a plan view of the color sensor chip 3 of FIG. 1. FIG. 3 is a cross-sectional view of the color sensor chip 3 cut along section line III-III of FIG. 2.

The color sensor chip 3 is an RGB sensor which is capable of detecting optic elements in a wavelength band of a visible ray (basically, its short-wavelength limit is 360 nm to 400 nm, and its long-wavelength limit is 760 nm to 830 nm) so as to divide the respective color signals of red (R), green (G), and blue (B).

The color sensor chip 3 includes a semiconductor substrate 10, and a color filer 11.

The semiconductor substrate 10 is, in the present preferred embodiment, an n-type silicon substrate. The semiconductor substrate 10 is defined as a rectangular shape in a plan view, and a light-receiving region 12 is set in its central portion, and an outer peripheral region 13 is set at the peripheral edge portion surrounding the light-receiving region 12.

A plurality of photodiodes 14R, 14G, and 14B and a dummy photodiode 15 are formed on the top surface portion of the semiconductor substrate 10 in the light-receiving region 12.

The plurality of photodiodes 14R, 14G, and 14B respectively and selectively detect an element in a red wavelength band (for example, 590 nm to 680 nm), an element in a green wavelength band (for example, 500 nm to 560 nm), and an element in a blue wavelength band (for example, 420 nm to 480 nm) among visible rays incident into the color sensor chip 3. The plurality of photodiodes 14R, 14G, and 14B are arranged from p-type semiconductor regions 16R, 16G, and 16B which are arrayed at given intervals from one another and the p-n junctions with the n-type semiconductor substrate 10.

The array mode of the plurality of p-type semiconductor regions 16R, 16G, and 16B is a square-lattice array in the present preferred embodiment. In this array mode, for example, as shown in FIG. 2, the two of the p-type semiconductor region 16R and the p-type semiconductor region 16B may be disposed opposite to one another, and the p-type semiconductor region 16B and the p-type semiconductor region 16G may be diagonally disposed opposite to one another. Thereby, an n-type boundary region 17 defined such that the regions among the photodiodes 14R, 14G, and 14B which are adjacent to one another are connected in a cross shape in a plan view is formed on the top surface portion of the semiconductor substrate 10. In addition, the array mode of the p-type semiconductor regions 16R, 16G, and 16B is not limited to a square-lattice array, and may be, for example, a honeycomb array or the like, and the positions of the p-type semiconductor regions 16R, 16G, and 16B in the respective array modes may be appropriately set.

A width $W_1$ of the n-type boundary region 17 (an interval between the p-type semiconductor regions 16R, 16G, and 16B adjacent to one another) is, for example, 5 μm to 25 μm. The dummy photodiode 15 is defined by a p-n junction between a p-type semiconductor region 18 formed in the n-type boundary region 17 and the n-type semiconductor substrate 10.

The p-type semiconductor region 18 is defined as a cross shape along the lines of the planar shape of the n-type boundary region 17, and the entire p-type semiconductor region 18 is housed in the n-type boundary region 17 so as not to protrude from the n-type boundary region 17 to the outside. Further, the p-type semiconductor region 18 is defined at intervals from the p-type semiconductor regions 16R, 16G, and 16B by interposing n-type portions on the both sides among the p-type semiconductor regions 16R, 16G, and 16B adjacent to one another. Moreover, in the present preferred embodiment, the p-type semiconductor regions 16R, 16G, and 16B and the p-type semiconductor region 18 respectively have depths which are the same as each other. Thereby, it is possible to simultaneously form the p-type semiconductor regions 16R, 16G, and 16B and the p-type semiconductor region 18 by selectively injecting and diffusing p-type dopant with respect to the top surface of the n-type semiconductor substrate 10.

The color filter 11 includes a red filter 19R, a green filter 19G, and a blue filter 19B. As the color filter 11, for example, a color resist film based on pigment, a transparent type resist film formed by use of a nanoimprint technology, a gelatin film, or the like may be used. In addition, in FIG. 2, in order to clearly delineate, the red filter 19R, the green filter 19G, and the blue filter 19B are respectively expressed by areas added by broken line hatching, dashed-dotted line hatching, and solid line hatching. Further, in FIG. 3, the red filter 19R and the blue filter 19B which are adjacent to one another among the red filter 19R, the green filter 19G, and the blue filter 19B are respectively shown as examples of the first filter and the second filter of the present invention.

The red filter 19R, the green filter 19G, and the blue filter 19B are respectively disposed immediately above the photodiodes 14R, 14G, and 14B, and integrally include main portions 20R, 20G, and 20B facing the respective photodiodes 14R, 14G, and 14B in a vertical direction (up-and-down direction), and peripheral edge portions 21R, 21G, and 21B which are led out of the respective main portions 20R, 20G, and 20B in a horizontal direction (cross direction).

The respective peripheral edge portions 21R, 21G, and 21B are respectively defined as a ring shape so as to surround the peripheries of the respective main portions 20R, 20G, and 20B in the present preferred embodiment. Further, the lead-out amounts from the respective main portions 20R, 20G, and 20B of the respective peripheral edge portions 21R, 21G, and 21B (the distances from the peripheral edges of the respective photodiodes 14R, 14G, and 14B up to the peripheral edges of the peripheral edge portions 21R, 21G, and 21B) are set to amounts over the half of the width $W_1$ of the n-type boundary region 17. For example, as shown in FIG. 3, the peripheral edge portions 21R and 21B are respectively extended so as to protrude toward the side closer to the photodiodes 14B and 14R than the central portion C in the width direction of the n-type boundary region 17. Thereby, making the respective lead-out amounts $W_2$ and $W_3$ of the peripheral edge portions 21R and 21B greater than the half of the width $W_1$ of the n-type boundary region 17.

In the present preferred embodiment, as described above, because the respective peripheral edge portions 21R, 21G, and 21B are formed so as to extend across the central portion C of the n-type boundary region 17, the adjacent peripheral edge portions 21R, 21G, and 21B overlap one another on the n-type boundary region 17. For example, in FIG. 2, the hatchings showing the respective filters 19R, 19G, and 19B are made crossover, thereby expressing the overlapping portion. Thereby, defining a filter laminated structure 22 by the overlapping of the peripheral edge portions 21R, 21G, and 21B in the color filter 11.

The filter laminated structure 22 is defined such that the peripheral edge portions 21R, 21G, and 21B of the respective filters 19R, 19G, and 19B overlap one another several times in the color sensor chip 3. For example, as shown in FIG. 3, the red filter 19R and the blue filter 19B are respectively arranged such that two color resist films are laminated. Then, at the portion of the filter laminated structure 22, the respective color resist films of the red filter 19R and the blue filter 19B are alternately laminated. In detail, the filter laminated structure 22 is arranged such that the downside film of the red filter 19R, the downside film of the blue filter 19B, the upside film of the red filter 19R, and the upside film of the blue filter 19B are laminated in sequence.

Such a filter laminated structure 22 may be defined such that, for example, a resist film of the red filter 19 is defined as a predetermined pattern on the top surface of a passivation film 25 which will be described later, and a resist film of the blue filter 19B is formed on this resist film as a pattern so as to overlap a part thereof with the red filter 19R. In the case where the films overlap several times as in FIG. 3, this process may be repeated several times.

Figure 3:
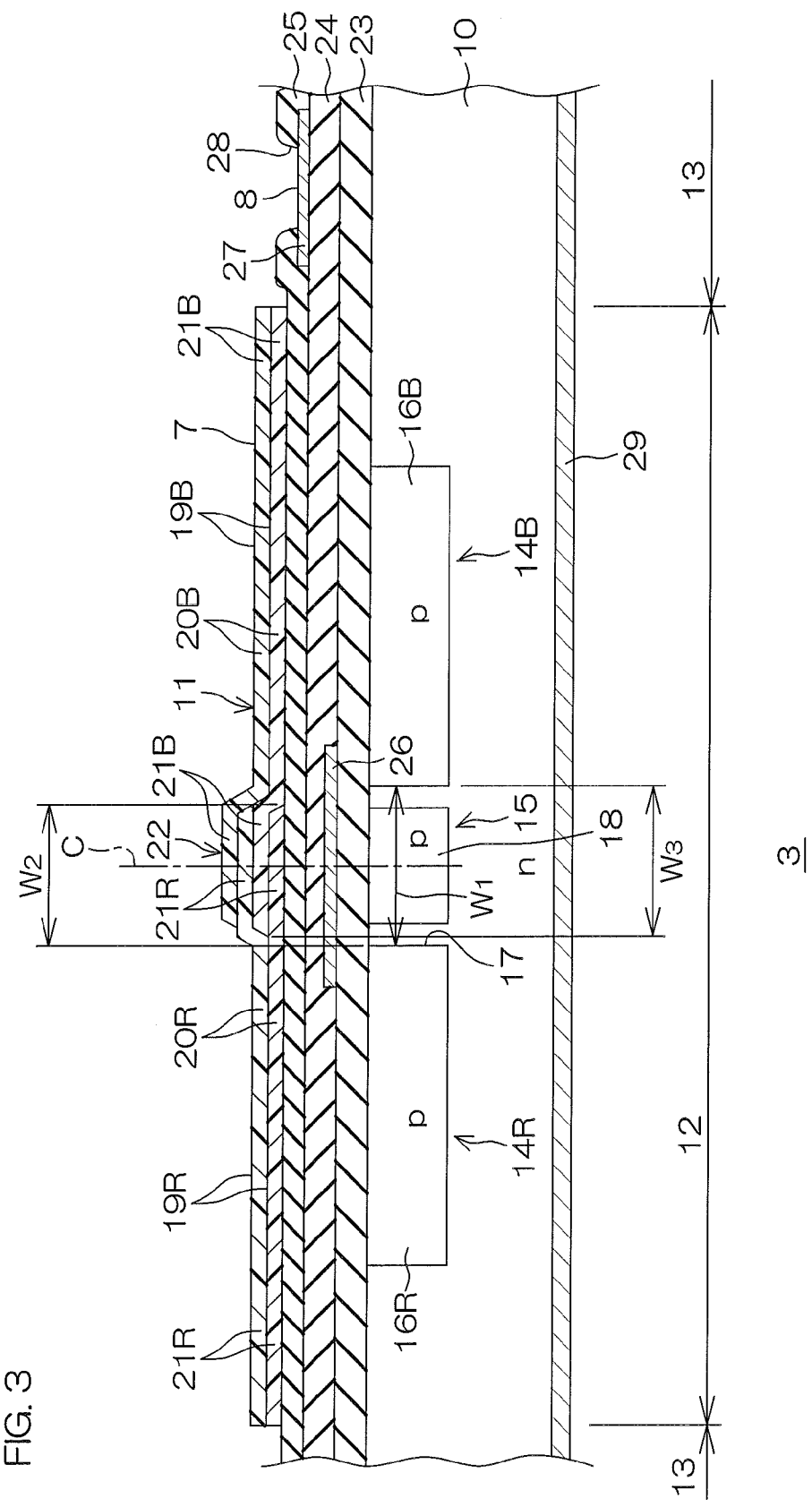
FIG. 3 is a cross-sectional view of the color sensor chip cut along section line III-III of FIG. 2.

As shown in FIG. 3, the color sensor chip 3 further includes a plurality of interlayer insulating films 23 and 24 and the passivation film 25 which are laminated in sequence from the semiconductor substrate 10 between the semiconductor substrate 10 and the color filter 11, and wiring layers 26 and 27 which are disposed on the plurality of interlayer insulating films 23 and 24. That is, the color sensor chip 3 has a multilayer wiring structure on the semiconductor substrate 10.

In the present preferred embodiment, the interlayer insulating films 23 and 24 are made of silicon oxide ($SiO_2$), the passivation film 25 is made of silicon nitride (SiN), and the wiring layers 26 and 27 are made of aluminum. In addition, the plurality of interlayer insulating films may be two layers as in FIG. 3, and may be more than two layers.

The interlayer insulating film 24 is an uppermost insulating film. The top surface of the light-receiving region 12 in this uppermost insulating film 24 is a flat surface on which no wiring layer is formed. On the other hand, a wiring layer 27 is formed on the uppermost insulating film 24 in the outer peripheral region 13. The wiring layer 27 exposes its parts as the electrode pads 8 from the passivation film 25.

The wiring layer 26 is disposed on the interlayer insulating film 23 lower than the uppermost insulating film 24 in the light-receiving region 12. In this way, the wiring layer 26 disposed in the light-receiving region 12 is formed on the interlayer insulating film 23 lower than the uppermost insulating film 24, thereby it is possible to flatten the interface between the passivation film 25 and the uppermost insulating film 24. In other words, when a wiring layer is formed in the light-receiving region 12 of the uppermost insulating film 24, the passivation film 25 is raised at the region in which the wiring layer is formed, and the raised region might cause a negative effect on the characteristics of the color filter 11. However, it is possible to reduce such a negative effect.

Further, the wiring layer 26 is formed along the top surface of the semiconductor substrate 10 so as to stride across the photodiode 14R and the photodiode 14B. In detail, the wiring layer 26 is defined as a cross shape along the lines of the planar shape of the p-type semiconductor region 18, and is housed in the n-type boundary region 17 so as not to protrude from the n-type boundary region 17 to the outside in a longitudinal direction (the straight line direction of the cross in the present preferred embodiment) of the n-type boundary region 17. On the other hand, the wiring layer 26 is formed so as to protrude (be led out) to the outside from the n-type boundary region 17 in a width direction of the n-type boundary region 17 perpendicular to the longitudinal direction, and overlaps the edge portions of the photodiode 14R and the photodiode 14B. That is, the wiring layer 26 has a lead-out portion which is led out to the internal regions of the p-type semiconductor region 16R and the p-type semiconductor region 16B with respect to the respect peripheral edges of the p-type semiconductor region 16R and the p-type semiconductor region 16B compartmenting the n-type boundary region 17.

The passivation film 25 is formed so as to cover the light-receiving region 12 and the outer peripheral region 13 of the uppermost insulating film 24. Pad openings 28 which are for exposing the wiring layer 27 as the electrode pads 8 are formed in the outer peripheral region 13 of the passivation film 25. The passivation film 25 is raised at a region in which the wiring layer 27 is formed. However, the outer peripheral region 13 in which this raised region is formed is a region in which the color filter 11 is not substantially formed as in FIG. 3, and even if the color filter 11 is formed, there is no photodiodes 14R and 14B immediately beneath it. Accordingly, even if the passivation film 25 is not flat, this hardly causes a negative effect on the characteristics of the color filter 11. Therefore, in the present preferred embodiment, it is possible to effectively utilize the outer peripheral region 13 as a space for defining the wiring layer 27 (the electrode pads 8).

Further, the color sensor chip 3 includes a cathode electrode 29 formed on the rear surface of the semiconductor substrate 10. The cathode electrode 29 is bonded to the entire rear surface of the semiconductor substrate 10, to be a cathode terminal common for the plurality of photodiodes 14R, 14G, and 14B, and the dummy photodiode 15. Further, the cathode electrode 29 is bonded to, for example, a die pad (not shown) in the package main body 2 (FIG. 1) via a bonding material such as a solder at the time of packaging the color sensor chip 3. On the other hand, although not shown, anode terminals are respectively provided individually to the plurality of photodiodes 14R, 14G, and 14B, and the dummy photodiode 15, and are respectively electrically connected to the electrode pads 8 on the outer peripheral region 13.

Next, the effects obtained by the color sensor chip 3 will be described with reference to FIGS. 4A and 4B, and FIG. 5.

Figure 4A:
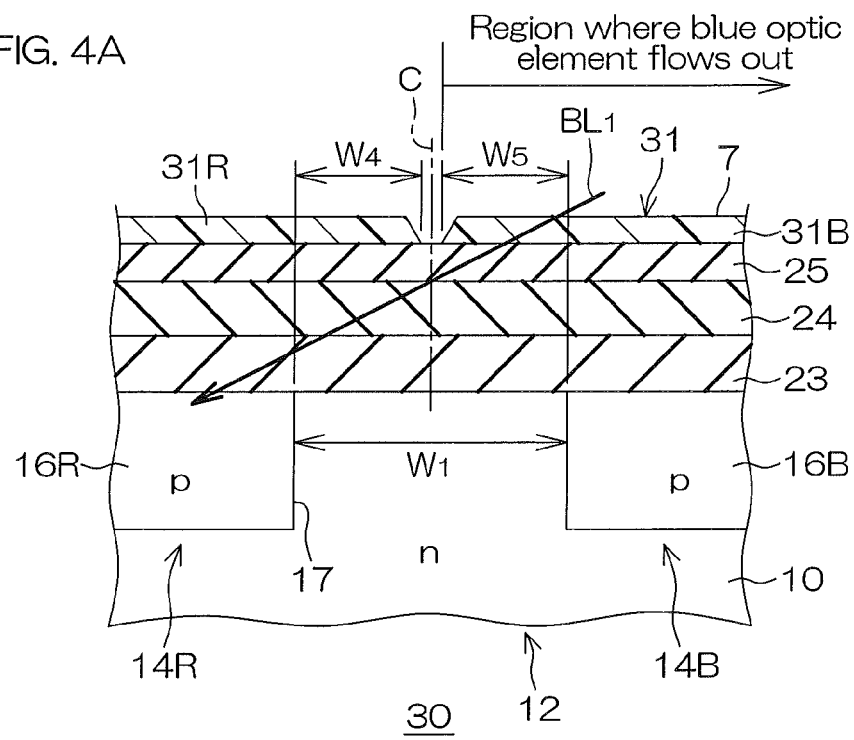
FIG. 4A is a cross-sectional view of a main portion of the color sensor chip according to a reference example for explanation of an effect of the present invention.

FIG. 4A is a cross-sectional view of a main portion of a color sensor chip 30 according to a reference example for explanation of an effect of the present invention. FIG. 4B is an enlarged view of a main portion of the color sensor chip 3 of FIG. 3 for explanation of the effect of the present invention. FIG. 5 is a graph showing the spectroscopic characteristics of an optic element after transmitting through a blue filter and a red filter.

First, the arrangement of the color sensor chip 30 according to the reference example will be described. In addition, in FIG. 4A, portions corresponding to the respective portions shown in FIG. 3 described above are shown by adding the same reference numerals thereto.

The color sensor chip 30 includes a color filter 31 including a red filter 31R and a blue filter 31B in place of the color filter 11 described above. The red filter 31R and the blue filter 31B are adjacent to one another at a minute interval in a horizontal direction so as to interpose the central portion C therebetween on the n-type boundary region 17.

However, the arrangement in which the red filter 31R and the blue filter 31B are adjacent to one another restricts, for example, a distance $W_4$ from the photodiode 14R to the peripheral edge of a region through which an optic element in a blue wavelength band is not allowed to transmit (a region covered by the red filter 31R) to the half or less of the width $W_1$ of the n-type boundary region 17. Therefore, it is impossible to secure a distance up to a region where the blue optic element flows out, broad. Therefore, as shown by an arrow $BL_1$ in FIG. 4A, an optic element which transmits through the blue filter 31B to be obliquely incident into the vicinity of the n-type boundary region 17 might be incident into the photodiode 14R. In addition, because the dummy photodiode 15 and the wiring layer 26 are not formed in the color sensor chip 30, there are no other means for cutting the blue optic element otherwise. As a result, in some cases, the blue optic element may be detected as a noise component by the photodiode 14R. Accordingly, in order to prevent a noise component from being detected in the arrangement of the color sensor chip 30, it is necessary to make the interval $W_1$ between the adjacent photodiode 14R and photodiode 14B as broad as possible.

Figure 4B:
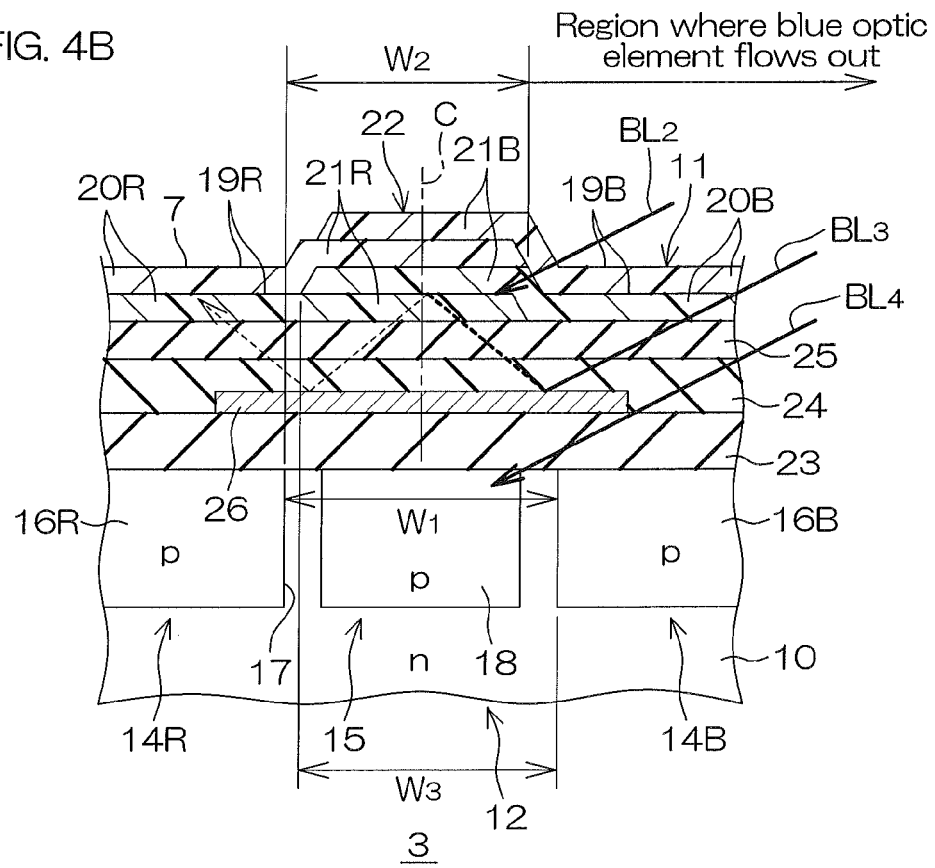
FIG. 4B is an enlarged view of a main portion of the color sensor chip of FIG. 3 for explanation of the effect of the present invention.

In contrast thereto, in the color sensor chip 3 in the present preferred embodiment, as shown in FIG. 4B, the filter laminated structure 22 is defined such that the red filter 19R and the blue filter 19B overlap one another, thereby, it is possible to extend the peripheral edge portion 21R and the peripheral edge portion 21B respectively up to the vicinities of the photodiode 14B and the photodiode 14R across the central portion C of the n-type boundary region 17. Thereby, it is possible to secure a distance $W_2$ from the photodiode 14R to a region through which the optic element in the blue wavelength band is not allowed to transmit (the region covered by the red filter 19R), broader than the distance $W_4$ in FIG. 4A. Therefore, even if the interval $W_1$ between the photodiode 14R and the photodiode 14B is relatively narrowed, it is possible to cut the blue optic element shown by an arrow $BL_2$ in FIG. 4B with the red filter 19R which is a part of the filter laminated structure 22. Therefore, it is possible to downsize the entire light-receiving region 12 by shortening a pitch between the photodiodes 14R and 14B while preventing a false detection of a noise component. Thereby, it is possible to provide the compact color sensor chip 3.

In the color sensor chip 3, the wiring layer 26 is further formed so as to stride across the photodiode 14R and the photodiode 14B immediately beneath the filter laminated structure 22. Thereby, even if the blue optic element (the noise component) transmits laterally through the filter laminated structure 22, to head toward the photodiode 14R as shown by an arrow $BL_3$ in FIG. 4B, it is possible to repeatedly reflect the noise component between the wiring layer 26 and the filter laminated structure 22 (see the zig-zag broken line in FIG. 4B), to be attenuated. Accordingly, even when the noise component is detected by the photodiode 14R, an effect on the detection accuracy may be sufficiently small.

In addition, in the present preferred embodiment, the wiring layer 26 is formed so as to overlap the edge portions of the photodiode 14R and the photodiode 14B. Therefore, it is possible to reliably prevent a noise component by an arrow $BL_3$ from being directly incident into the photodiode 14R. That is, it is possible to reliably reflect the noise component between the wiring layer 26 and the filter laminated structure 22. Further, because the wiring layer 26 is made of aluminum, for example, in the case where an aluminum wiring is formed on the interlayer insulating film 23, it is possible to form the wiring layer 26 in the same process as the aluminum wiring.

Further, the dummy photodiode 15 having a p-n junction is formed on the top surface portion of the semiconductor substrate 10 immediately beneath the wiring layer 26, that is, in the n-type boundary region 17. Therefore, the p-n junction of the dummy photodiode 15 is inversely-biased, thereby, as shown by an arrow $BL_4$ in FIG. 4B, even when it is impossible to reflect a noise component transmitting laterally through the filter laminated structure 22, by the wiring layer 26, it is possible to absorb the noise component with the p-n junction portion of the dummy photodiode 15. In addition, an n-p-n transistor is formed in the n-type boundary region 17, thereby it is possible to obtain the effect which is the same described above by utilizing a parasitic diode of the n-p-n transistor.

The above effect has been described as an example in the case where a visible optic element (a noise component) other than the red wavelength band heads toward the photodiode 14R. However, it is possible to obtain the same effect even in the case where an element which may be a noise component for the photodiode heads toward the photodiodes 14G and 14B. That is, in the present preferred embodiment, because the red filter 19R, the green filter 19G, and the blue filter 19B define the filter laminated structure 22 together with the filters adjacent to one another, it is possible to obtain the same effect by the filter laminated structure 22.

Figure 5:
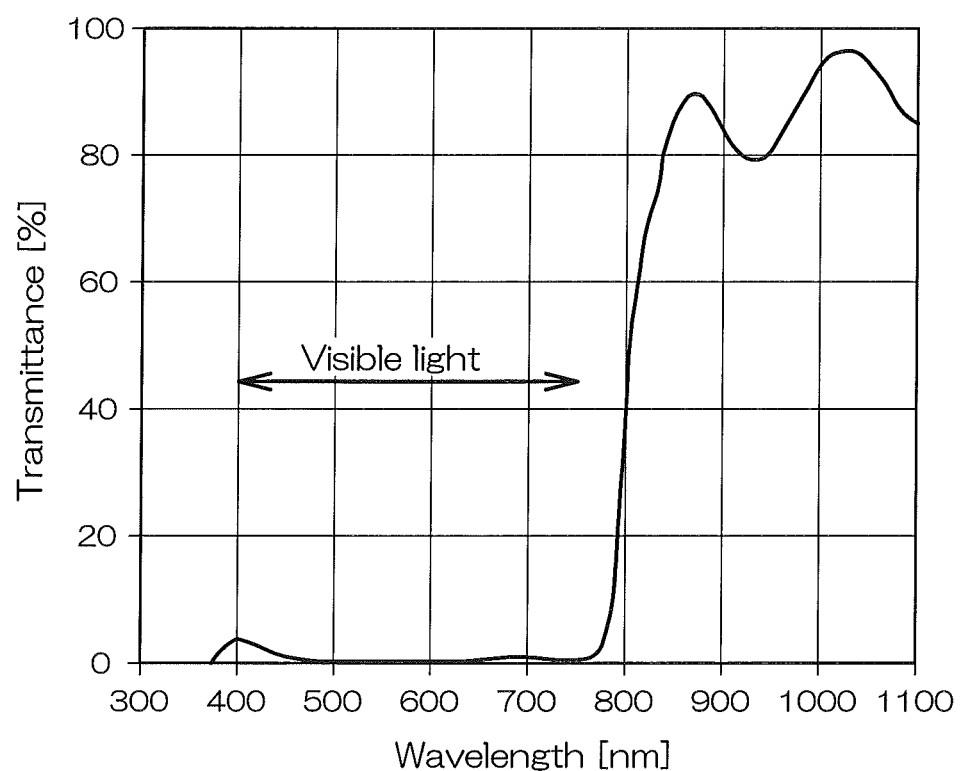
FIG. 5 is a graph showing the spectroscopic characteristics of an optic element after transmitting through a blue filter and a red filter.

Then, it is proved by FIG. 5 that the optic element after transmitting through the filter laminated structure 22 including the red filter 19R and the blue filter 19B does not contain the both elements in the blue and red wavelength bands.

Further, as shown in FIG. 5, it is clear that the transmitted light has a peak only in an infrared wavelength band (for example, 850 nm to 950 nm), and has few or no peaks in a wavelength band of a visible ray containing the red and blue elements (basically, its short-wavelength limit is 360 nm to 400 nm, and its long-wavelength limit is 760 nm to 830 nm). From the result of FIG. 5, it is proved that the filter laminated structure 22 of the present preferred embodiment is capable of cutting both of the red and blue optic elements. In addition, it is possible to easily cut an element in the infrared wavelength band in which the peak is shown in the graph of FIG. 5 by the infrared filter 4 in FIG. 1 or an infrared multilayer film interference filter.

The preferred embodiment of the present invention has been described above. However, the present invention may be implemented by another preferred embodiment.

Figure 6:
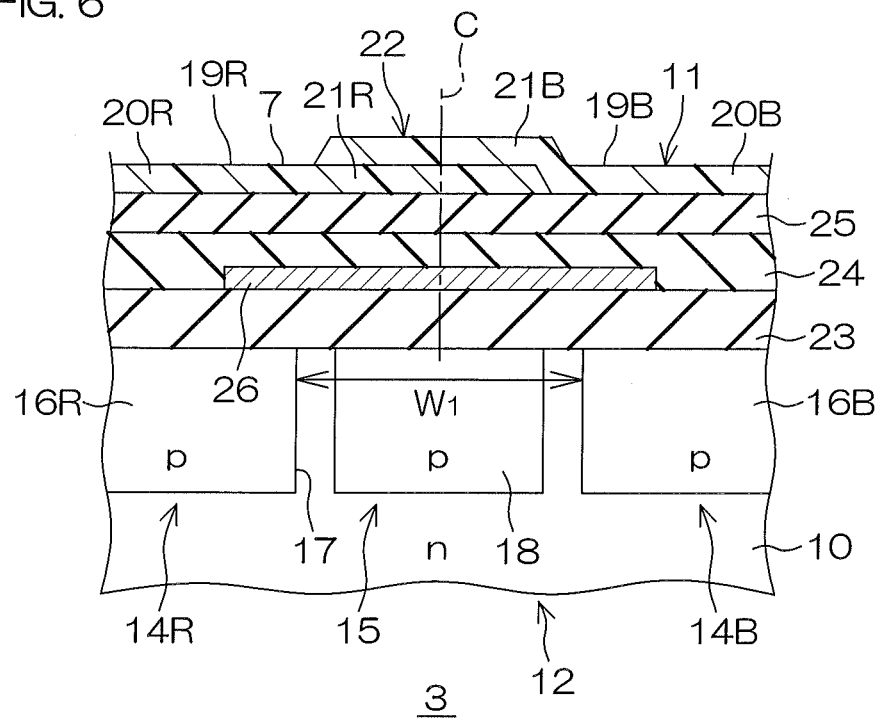
FIG. 6 is a diagram showing a modified example of the color sensor chip shown in FIG. 3.

For example, in the color sensor chip 3, as shown in FIG. 6, the filter laminated structure 22 may be defined such that the peripheral edge portions 21R and 21B of the respective filters 19R and 19B overlap only one time.

Figure 7:
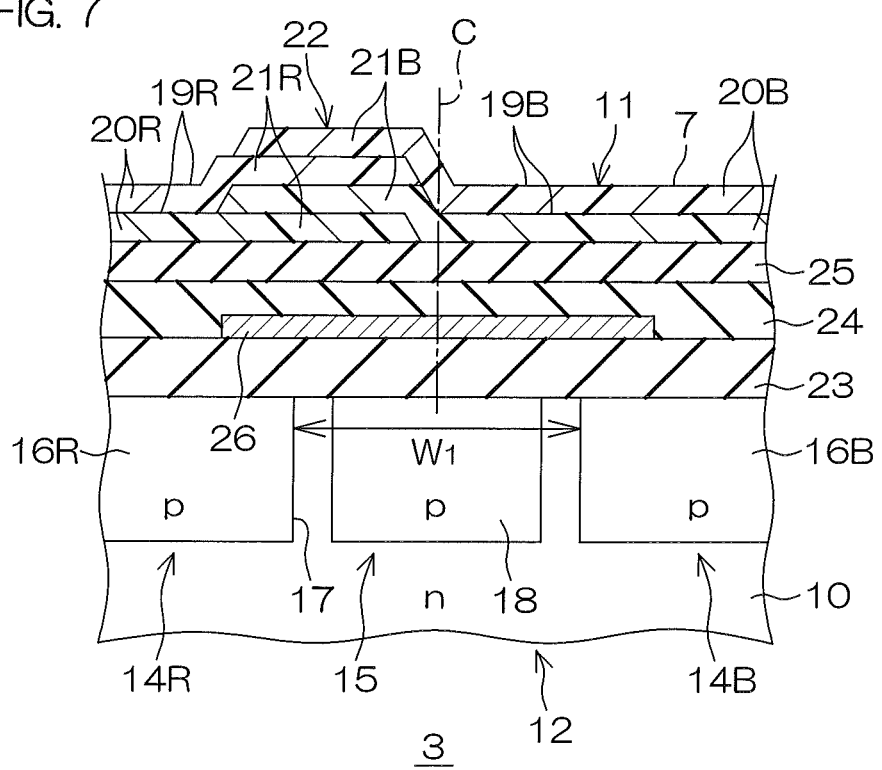
FIG. 7 is a diagram showing another modified example of the color sensor chip shown in FIG. 3.

Further, in the color sensor chip 3, the peripheral edge portions 21R, 21G, and 21B of the respective filters 19R, 19G, and 19B may not be extended across the central portion C of the n-type boundary region 17. For example, as shown in FIG. 7, the peripheral edge portion 21R of the red filter 19R may be disposed on the nearer side (the side close to the photodiode 14R) than the central portion C of the n-type boundary region 17.

Further, in the preferred embodiment of the aforementioned preferred embodiment, an infrared multilayer film interference filter which selectively cuts an element in an infrared wavelength band of light may further be laminated on the color filter 11. In this case, the infrared filter 4 may be omitted in the sensor package 1.

Further, in addition to the plurality of photodiodes 14R, 14G, and 14B and the dummy diode 15, various types of circuit elements such as a transistor, a capacitor, and a resister which arrange an integrated circuit such as an LSI (Large Scale Integration) may be formed on the semiconductor substrate 10.

Further, the photodetection device of the present invention may be applied to, not only a color sensor, but also an optical sensor having a plurality of optical filters, such as an illumination sensor or a proximity sensor. Moreover, these optical sensors may be installed in, for example, a smartphone, a mobile telephone, a digital camera, a car-navigation system, a laptop computer, a tablet PC, or the like.

Figure 8:
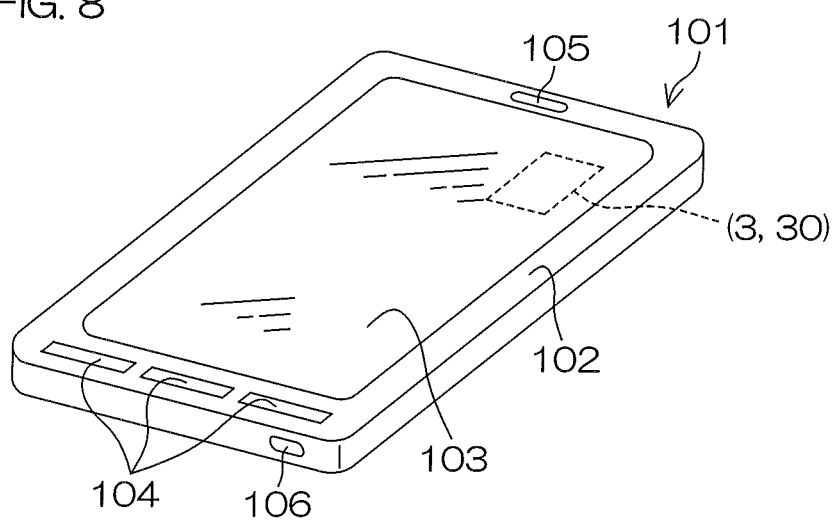
FIG. 8 is an external view of a smartphone according to a preferred embodiment of the present invention.

For example, a smartphone 101 according to a preferred embodiment of the present invention has an appearance shown in FIG. 8.

The smartphone 101 is arranged so as to house electric parts (for example, the aforementioned color sensor chips 3 and 30, and the like) inside a flat cubic-shaped casing 102.

The casing 102 has a pair of oblong principal surfaces on the upper side and the rear side, and the pair of principal surfaces are connected with the four side surfaces. A display surface of a display panel 103 which is arranged from a liquid crystal panel, an organic EL panel, and the like, is exposed to one principal surface of the casing 102. The display surface of the display panel 103 arranges a touch-panel, which provides an input interface to a user.

The display panel 103 is defined as a rectangular shape to account for a large part of the one principal surface of the casing 102. Manual operation buttons 104 are disposed so as to be along one narrow side of the display panel 103. In the present preferred embodiment, the plurality of (three) manual operation buttons 104 are arrayed along the narrow side of the display panel 103. A user operates the manual operation buttons 104 and the touch panel, thereby it is possible to operate the smartphone 101, so as to call a necessary function, to execute the function.

A speaker 105 is disposed in the vicinity of the other narrow side of the display panel 103. The speaker 105 provides an earpiece for telephone function, and may be used as an acoustic conversion unit for reproducing music data and the like. On the other hand, a microphone 106 is disposed in one side surface of the casing 102 in the vicinity of the manual operation buttons 104. The microphone 106 provides a mouthpiece for telephone function, and may be used as a microphone for sound recording.

In addition, various types of design changes are applicable within the scope of matters described in the following claims.

What is claimed is:

1. A photodetection device comprising:
a semiconductor substrate having a first light-receiving portion and a second light-receiving portion; and
an optical filter formed on the semiconductor substrate, the optical filter including a first filter covering the first light-receiving portion and a second filter covering the second light-receiving portion, wherein
the first filter is permeable allowing an optic element within a first wavelength band to pass through the same, the second filter is permeable allowing an optic element within a second wavelength band different from the first wavelength band, to pass through the same, and
the optical filter has a filter laminated structure which is defined such that edge portions of the first filter and the second filter overlap one another on a boundary region between the first light-receiving portion and the second light-receiving portion.

2. The photodetection device according to claim 1, wherein the edge portions of the first filter and the second filter are respectively extended up to a side closer to the second light-receiving portion and the first light-receiving portion than a center of the boundary region.

3. The photodetection device according to claim 1 further comprising a metal layer formed along a top surface of the semiconductor substrate between the filter laminated structure and the boundary region.

4. The photodetection device according to claim 3, wherein the metal layer overlaps edge portions of the first light-receiving portion and/or the second light-receiving portion.

5. The photodetection device according to claim 3 further comprising a plurality of interlayer insulating films and a passivation film which are laminated in sequence from the semiconductor substrate between the semiconductor substrate and the optical filter, wherein
the metal layer is disposed on an interlayer insulating film lower than an uppermost insulating film among the plurality of interlayer insulating films.

6. The photodetection device according to claim 5 further comprising an uppermost wiring which is formed on the uppermost insulating film outside of a region covered by the optical filter, and is covered with the passivation film.

7. The photodetection device according to claim 3, wherein the metal layer is made of aluminum.

8. The photodetection device according to claim 3 further comprising a p-n junction portion formed on a top surface portion of the semiconductor substrate under the metal layer.

9. The photodetection device according to claim 1 further comprising a p-n junction portion formed on the top surface portion of the semiconductor substrate between the filter laminated structure and the boundary region.

10. The photodetection device according to claim 1, wherein the filter laminated structure is defined such that the first filter and the second filter overlap one another several times.

11. The photodetection device according to claim 1, wherein the optical filter includes a color filter.

12. The photodetection device according to claim 1, wherein a width of the boundary region is 5 μm to 25 μm.

13. A sensor package comprising a photodetection device, wherein
the photodetection device includes
a semiconductor substrate having a first light-receiving portion and a second light-receiving portion, and
an optical filter formed on the semiconductor substrate, the optical filter including a first filter covering the first light-receiving portion and a second filter covering the second light-receiving portion, and
the first filter is permeable allowing an optic element within a first wavelength band to pass through the same, the second filter is permeable allowing an optic element within a second wavelength band different from the first wavelength band, to pass through the same, and
the optical filter has a filter laminated structure which is defined such that edge portions of the first filter and the second filter overlap one another on a boundary region between the first light-receiving portion and the second light-receiving portion.

14. An electronic equipment comprising a photodetection device, wherein
the electronic equipment includes
a semiconductor substrate having a first light-receiving portion and a second light-receiving portion, and
an optical filter formed on the semiconductor substrate, the optical filter including a first filter covering the first light-receiving portion and a second filter covering the second light-receiving portion, and
the first filter is permeable allowing an optic element within a first wavelength band to pass through the same, the second filter is permeable allowing an optic element within a second wavelength band different from the first wavelength band, to pass through the same, and
the optical filter has a filter laminated structure which is defined such that edge portions of the first filter and the second filter overlap one another on a boundary region between the first light-receiving portion and the second light-receiving portion.

\* \* \* \* \*